United States Patent
Kikuchi et al.

(10) Patent No.: US 7,163,849 B2
(45) Date of Patent: Jan. 16, 2007

(54) FABRICATION METHOD OF SEMICONDUCTOR INTEGRATED CIRCUIT DEVICE

(75) Inventors: Hiroaki Kikuchi, Chitose (JP);
Toshiaki Sawada, Koganei (JP);
Hirohiko Yamamoto, Hachioji (JP)

(73) Assignees: Renesas Technology Corp., Tokyo (JP); Hitachi ULSI Systems Co., Ltd., Tokyo (JP); Renesas Northern Japan Semiconductor, Inc., Chitose (JP)

( * ) Notice: Subject to any disclaimer, the term of this patent is extended or adjusted under 35 U.S.C. 154(b) by 200 days.

(21) Appl. No.: 10/500,931

(22) PCT Filed: Jan. 8, 2003

(86) PCT No.: PCT/JP03/00068

§ 371 (c)(1),
(2), (4) Date: Jul. 8, 2004

(87) PCT Pub. No.: WO03/060970

PCT Pub. Date: Jul. 24, 2003

(65) Prior Publication Data

US 2005/0020039 A1    Jan. 27, 2005

(30) Foreign Application Priority Data

Jan. 9, 2002    (JP)    ................................ 2002-2507

(51) Int. Cl.
*H01L 21/00*    (2006.01)

(52) U.S. Cl. ....................... 438/149; 438/905; 438/909; 257/E21.001

(58) Field of Classification Search ..................... None
See application file for complete search history.

(56) References Cited

U.S. PATENT DOCUMENTS 6,146,929 A * 11/2000 Oana et al. .................. 438/151

(Continued)

FOREIGN PATENT DOCUMENTS

JP    5-217910    8/1993

(Continued)

OTHER PUBLICATIONS

Japanese document ISBN 957-21-2546-X dated Sep. 9, 1999, pp. 5-30 and 5-31.

*Primary Examiner*—Michael Lebentritt
*Assistant Examiner*—Stanetta Isaac
(74) *Attorney, Agent, or Firm*—Antonelli, Terry, Stout and Kraus, LLP.

(57) ABSTRACT

Upon formation of an impurity-added silicon film by a low-pressure CVD apparatus, diffusion of an impurity from another similar silicon film, which has already been formed over the inside walls of the deposition chamber, is suppressed in the following manner. After insertion of a semiconductor substrate, having a gate oxide film (insulating film) formed thereover, into the deposition chamber of a CVD apparatus (first film forming apparatus), the inside of the deposition chamber is heated while minimizing, relative to a time A required for heating of the inside of the deposition chamber under atmospheric pressure, a time B required for the subsequent heating in the deposition chamber under a pressure adjusted to vacuum or not greater than atmospheric pressure. The formation of an impurity-added silicon film is then started. At this time, the relation between A and B is controlled to satisfy the following equation: $0.1 \times B \leq A \leq 13 \times B$.

4 Claims, 12 Drawing Sheets

U.S. PATENT DOCUMENTS

| | | | |
|---|---|---|---|
| 6,270,580 B1 * | 8/2001 | Vu et al. | 118/666 |
| 6,399,411 B1 * | 6/2002 | Hori et al. | 438/62 |
| 6,720,274 B1 * | 4/2004 | Ozaki et al. | 438/758 |
| 6,787,377 B1 * | 9/2004 | Wang et al. | 438/14 |
| 6,903,030 B1 * | 6/2005 | Ishii et al. | 438/782 |

FOREIGN PATENT DOCUMENTS

| | | |
|---|---|---|
| JP | 7-230955 | 8/1995 |

* cited by examiner (a)

A=0
B=0
C=0
D=3

/=293

(b)

A=2
B=0
C=0
D=6

/=288

(a)

A=56
B=0
C=48
D=58

/=134

(b)

A=65
B=0
C=26
D=49

/=156

FABRICATION METHOD OF SEMICONDUCTOR INTEGRATED CIRCUIT DEVICE

TECHNICAL FIELD

The present invention relates to a technique for the fabrication of a semiconductor integrated circuit device, and, more particularly, to a technique that is effective when applied to a step of depositing, by CVD (Chemical Vapor Deposition), a silicon film having an impurity ion introduced therein.

BACKGROUND OF THE INVENTION

As a material for a gate electrode of a MISFET (Metal Insulator Semiconductor Field Effect Transistor), a polycrystalline silicon film having an impurity added thereto is employed, for example. As the impurity to be added, $AsH_3$, $PH_3$ or the like can be used for an n-channel MISFET, while $B_2H_6$ or the like can be used for a p-channel MISFET.

Such a polycrystalline silicon film can be formed, for example, by using a low-pressure CVD apparatus. There is a description of a low-pressure CVD apparatus on p 187, "Technological Dictionary of Semiconductor Equipment (Fourth Edition)", ed. by Semiconductor Equipment Association Japan, published by THE NIKKAN KOGYO SHIMBUN, LTD. on Nov. 20, 1997.

However, the present inventors have found that the use of such a low-pressure CVD apparatus involves problems, as described below.

A polycrystalline silicon film having an impurity added thereto, as described above, is formed as a material for a gate electrode of a MISFET using a low-pressure CVD apparatus by inserting a semiconductor wafer into a deposition chamber, waiting for a predetermined time until the temperature in the deposition chamber becomes adequate, while reducing the pressure in the deposition chamber to a vacuum or not greater than atmospheric pressure, and then introducing a film forming gas in the deposition chamber. At this time, the polycrystalline silicon film is formed not only over the surface of the semiconductor wafer, but also over the inside walls of the deposition chamber. When the formation of a similar polycrystalline silicon film over a newly-fed semiconductor wafer follows, it is also necessary to wait for a predetermined time until the temperature in the deposition chamber increases to an adequate level, while reducing the pressure in the deposition chamber to a vacuum or not greater than atmospheric pressure. During this period, some of the impurity inevitably diffuses from the polycrystalline silicon film formed on the inside walls of the deposition chamber. This diffused impurity scatters to the newly-fed semiconductor wafer on which a polycrystalline silicon film has not yet been formed, and it is introduced into the gate oxide film already formed over the surface of the previously-fed semiconductor wafer. This deteriorates the insulation properties of the gate oxide film.

An object of the present invention is to provide a technique for preventing, upon formation of an impurity-added polycrystalline film by a low pressure CVD apparatus, diffusion of an impurity into the inside walls of the deposition chamber from a similar polycrystalline film which has already been formed.

The above-described and the other objects and novel features of the present invention will be apparent from the description provided herein and the accompanying drawings.

SUMMARY OF THE INVENTION

Typical aspects of the inventions disclosed in the present application will be outlined briefly.

The present invention provides a method which comprises the steps of: inserting a semiconductor substrate in a deposition chamber of a first film forming apparatus; heating the inside of the deposition chamber; and, after the heating step, forming a silicon film, to which a conductive impurity has been added, over the semiconductor substrate by a chemical film forming method, the heating step comprising:

(a) heating the inside of the deposition chamber while maintaining the pressure in the deposition chamber at atmospheric pressure; and (b) after the step (a), heating the inside of the deposition chamber while reducing the pressure inside of the deposition chamber to a vacuum or not greater than atmospheric pressure; wherein the step (a) takes more time than the step (b).

The present invention also provides a method which comprises the steps of: forming an insulating film over a semiconductor substrate and then inserting the semiconductor substrate in a deposition chamber of a first film forming apparatus; heating the semiconductor substrate while maintaining the pressure in the deposition chamber at atmospheric pressure; after heating the semiconductor substrate, reducing the pressure in the deposition chamber to a vacuum or not greater than atmospheric pressure, while heating the semiconductor substrate; and forming a semiconductor film, to which a conductive impurity has been added, over the insulating film by a chemical film forming method, wherein in the step of heating the semiconductor substrate while maintaining the pressure in the deposition chamber at atmospheric pressure, the semiconductor substrate is heated to a first temperature of the semiconductor substrate upon film formation of the semiconductor film or the semiconductor substrate is heated to bring its temperature close to the first temperature.

The present invention also provides a method which comprises the steps of forming an insulating film over a semiconductor substrate; inserting the semiconductor substrate into a deposition chamber of a first film forming apparatus; heating the semiconductor substrate to a first temperature, while keeping the pressure in the deposition chamber at a first pressure; reducing the pressure in the deposition chamber to not greater than a second pressure, while heating the semiconductor substrate; and forming a silicon film added a conductive impurity has been added, over the insulating film of the semiconductor substrate heated to the first temperature by a chemical film forming method while maintaining the pressure in the deposition chamber at a vacuum or a third pressure not greater than atmospheric pressure; wherein the second pressure is adjusted to be lower than the third pressure and the first pressure is higher than the third pressure.

The present invention still further provides a method which comprises the steps of forming an insulating film over a semiconductor substrate; inserting the semiconductor substrate into a deposition chamber of a first film forming apparatus; heating the semiconductor substrate while keeping the pressure in the deposition chamber at a first pressure; reducing the pressure in the deposition chamber to not greater than a second pressure, while heating the semiconductor substrate; and forming a silicon film, to which a conductive impurity has been added, over the insulating film by chemical film formation means, while keeping the pressure in the deposition chamber at a vacuum or a third pressure not greater than atmospheric pressure; wherein the second pressure is adjusted to be lower than the third pressure, and in the silicon film forming step, the semiconductor substrate is heated to bring its temperature close to the first temperature, while maintaining the first pressure at a level higher than the third pressure.

BEST MODE FOR CARRYING OUT THE INVENTION

Figure 1:
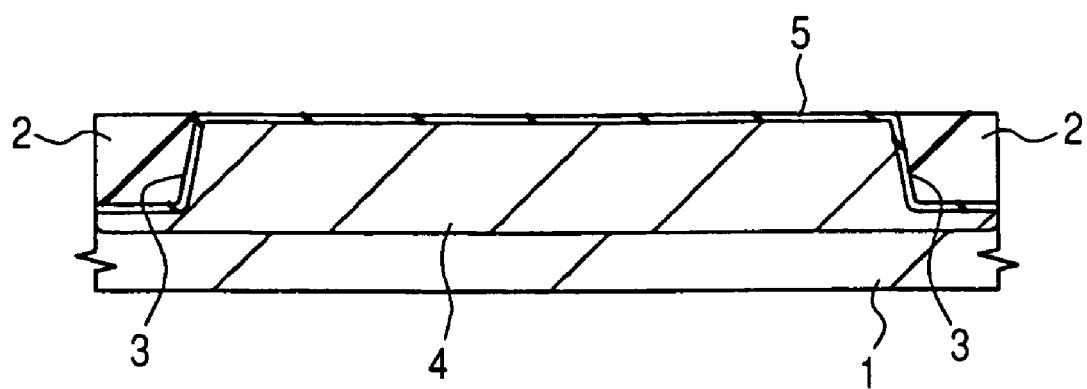
FIG. 1 is a fragmentary cross-sectional view illustrating a step in the fabrication of a semiconductor integrated circuit device according to one embodiment of the present invention.

The embodiments of the present invention will be described hereinafter with reference to the accompanying drawings (in all of the drawings, elements having a like function will be identified by like reference numerals and overlapping descriptions thereof will be omitted).

Embodiment 1

The method of fabrication of the semiconductor integrated circuit device according to this Embodiment 1 will be described in the order of FIGS. 1 to 9.

As illustrated in FIG. 1, a semiconductor substrate 1 made of single crystal silicon is heat treated to form a silicon oxide film (pad oxide film) as thin as about 10 nm over the main surface of the substrate. Then, after deposition of a silicon nitride film to about 120 nm thick over the silicon oxide film by CVD, dry etching is conducted, using with a photoresist film as a mask, to remove the silicon nitride film and silicon oxide film from an element isolation region.

By dry etching using the silicon nitride film as a mask, a groove which is about 350 nm deep is formed in the semiconductor substrate 1 in the element isolation region. The semiconductor substrate 1 is then heat treated to form a silicon oxide film as thin as about 10 nm over the inside walls of the groove in order to remove a damaged layer, that has formed over the inside walls of the groove, by etching.

After deposition of a silicon oxide film 2 over the semiconductor substrate 1 by CVD, the semiconductor substrate 1 is heat treated to densify the silicon oxide film 2 so as to improve the quality of the silicon oxide film 2. With the silicon nitride film serving as a stopper, the silicon oxide film 2 is then polished by chemical mechanical polishing (CMP) to leave it inside of the groove, whereby an element isolating groove 3 having a planarized surface is formed.

The silicon nitride film remaining over the active region of the semiconductor substrate 1 is then removed by wet etching with hot phosphoric acid, followed by implantation of an impurity ion (for example, B (boron)) having a p type conductivity into the active region to form a p well 4. The semiconductor substrate 1 is then heat treated to form a clean gate oxide film (insulating film) 5 over the surface of the p well 4.

Figure 2:
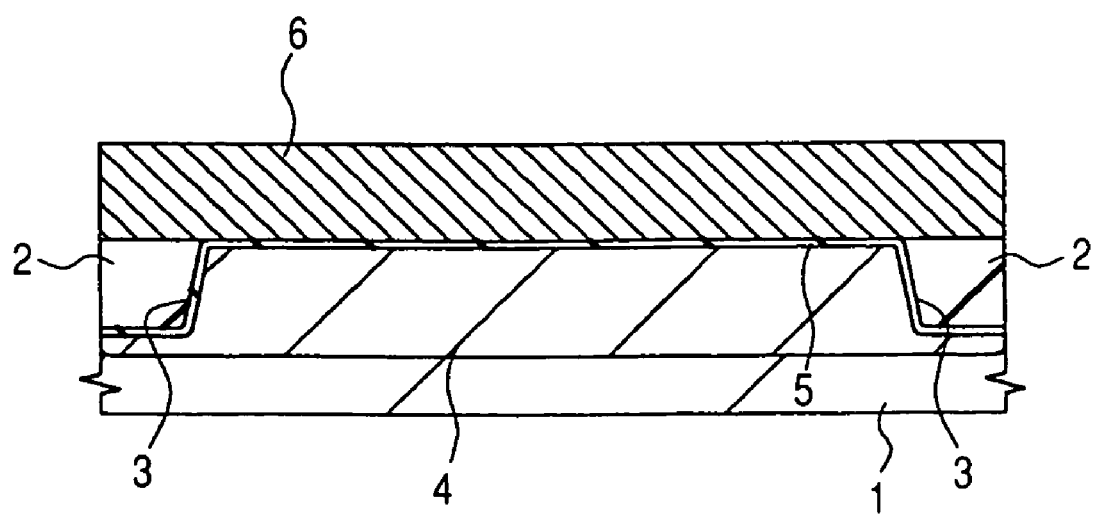
FIG. 2 is a fragmentary cross-sectional view illustrating the semiconductor integrated circuit device during a fabrication step following that of FIG. 1.
Figure 3:
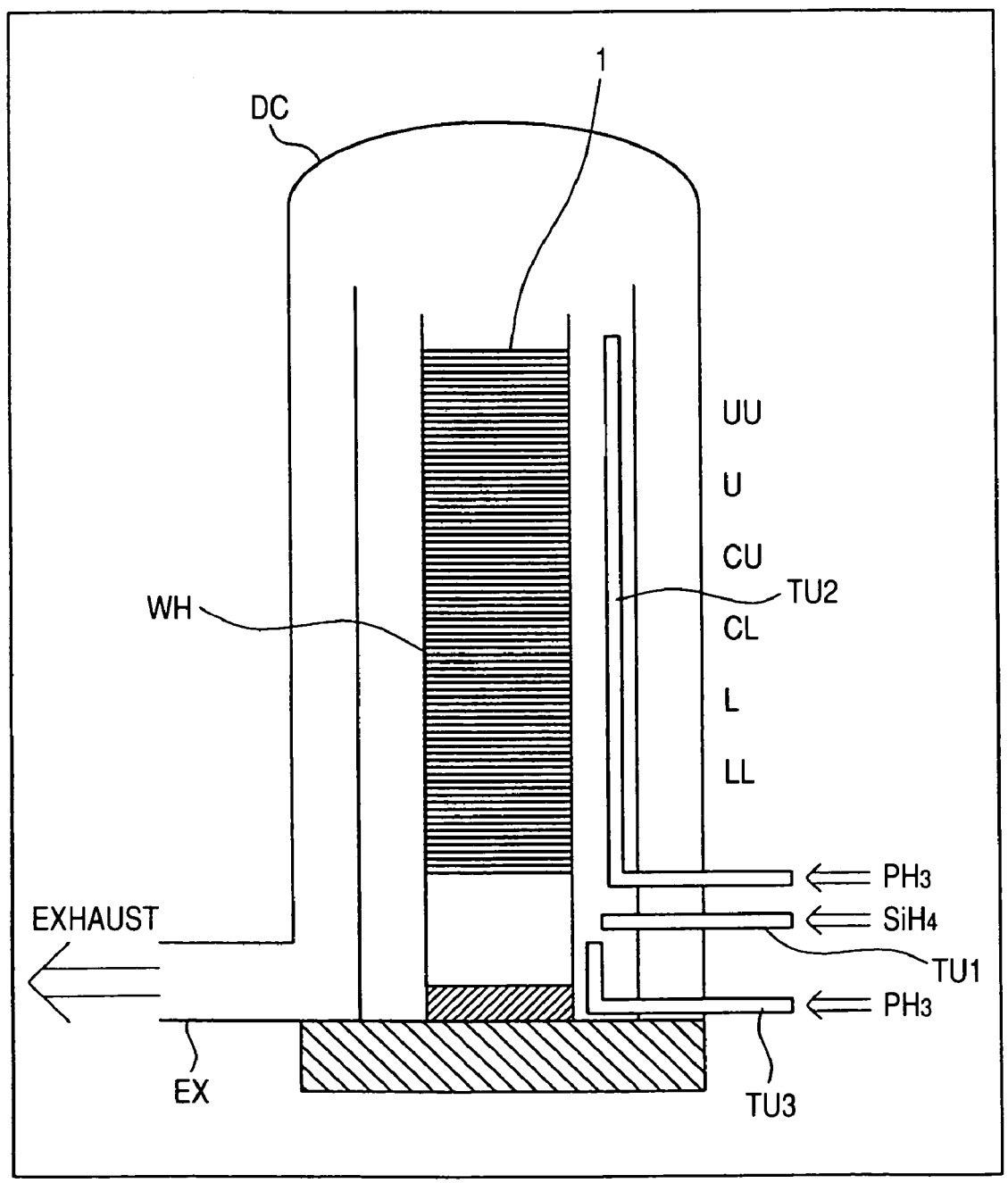
FIG. 3 is a diagram illustrating the composition of a CVD apparatus to be used for the fabrication of the semiconductor integrated circuit device according to the one embodiment of the present invention.

As illustrated in FIG. 2, a polycrystalline silicon film 6, to which an impurity has been added, having an n type conductivity, for example, $PH_3$ is deposited by CVD (chemical film forming method). The deposition of this polycrystalline silicon film 6 can be conducted using, for example, a batch system low pressure CVD apparatus (first film forming apparatus), as illustrated in FIG. 3. This low pressure CVD apparatus has, in a deposition chamber DC thereof, a wafer holder WH for holding thereon the semiconductor substrate 1. Into the deposition chamber DC, an $SiH_4$ gas is fed through a tube TU 1. The polycrystalline silicon film 6 can be formed by the thermal decomposition of this $SiH_4$ gas. By feeding a $PH_3$ gas into the deposition chamber DC from tubes TU2 and TU3, $PH_3$ can be added to the polycrystalline silicon film 6. The SiH$_4$ gas and PH$_3$ gas introduced into the deposition chamber DC can be discharged from an exhaust port EX. The symbols in the drawing, that is, UU, U, CU, CL, L and LL, each indicate an index of a height at which the semiconductor substrate 1 is held in the deposition chamber DC.

Figure 4:
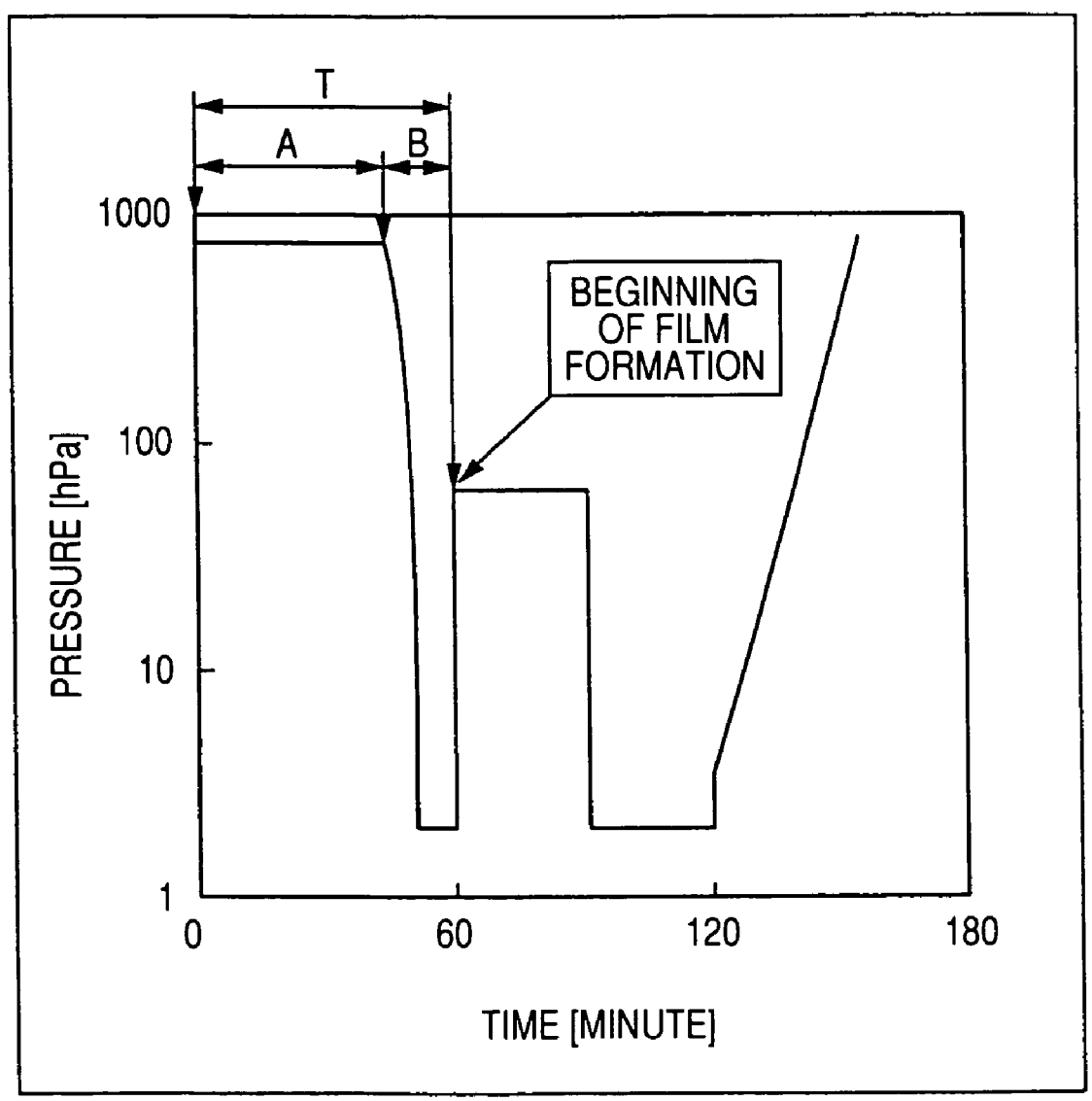
FIG. 4 is a time chart upon deposition of a polycrystalline silicon film during fabrication of the semiconductor integrated circuit device according to the one embodiment of the present invention.
Figure 5:
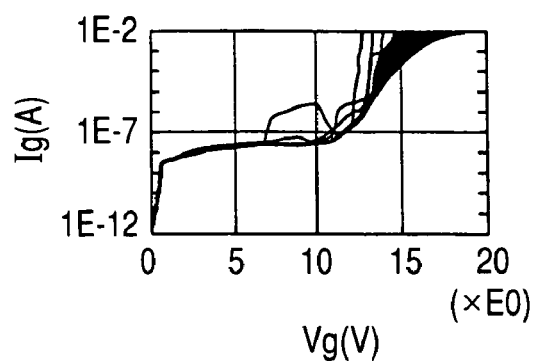
FIGS. 5(a) and 5(b) are graphs with accompanying diagrams illustrating insulation properties of a gate oxide film when a polycrystalline silicon film is formed by fabrication of the semiconductor integrated circuit device according to the one embodiment of the present invention.
Figure 5:
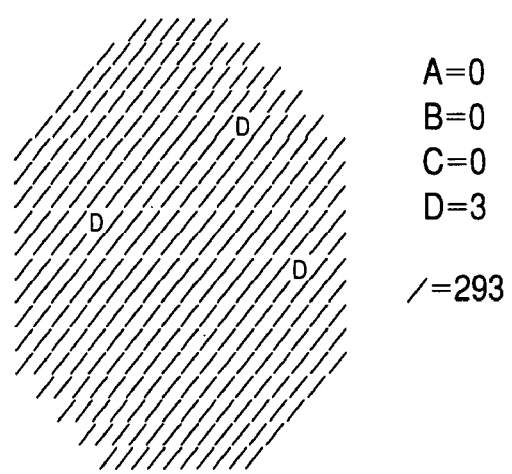
Figure 5:
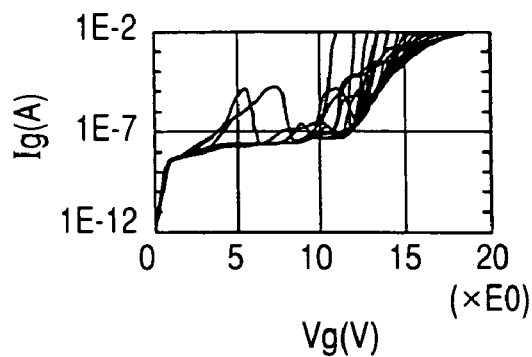
Figure 5:
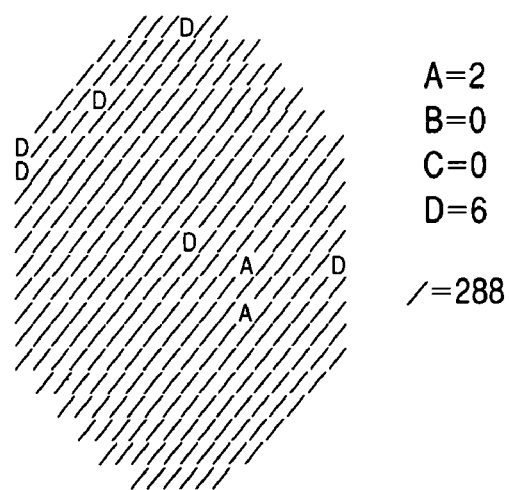

In this Embodiment 1, the polycrystalline silicon film 6 is formed in accordance with the time chart shown in FIG. 4. In FIG. 4, the symbol "T" stands for a time necessary for heating the inside of the deposition chamber DC before starting of the film formation, and it can be defined by the capacity in the deposition chamber. The symbol "A" stands for a time necessary for heating the inside of the deposition chamber under atmospheric pressure after the semiconductor substrate 1 is inserted into the deposition chamber DC, while the symbol "B" stands for a time necessary for the heating step when the pressure inside of the deposition chamber DC is reduced to a vacuum or not greater than atmospheric pressure. The time T is defined by the sum of A and B.

The polycrystalline silicon film 6 is inevitably formed not only over the semiconductor substrate 1, but also over the inside walls of the deposition chamber DC, and over the tubes TU1, TU2 and TU3 in the deposition chamber DC as illustrated in FIG. 3. This CVD apparatus is used in repetition for the formation of the polycrystalline silicon film 6. When a new semiconductor substrate 1 is inserted into the deposition chamber DC, the polycrystalline silicon film 6 has already been formed over various places in the deposition chamber DC. When the deposition chamber DC is heated for long hours under such a state, while the pressure in the deposition chamber DC is maintained at a vacuum or not greater than the atmospheric pressure, PH$_3$ contained in the polycrystalline silicon film 6, which has been formed over various places in the deposition chamber DC, is diffused from the polycrystalline silicon film 6. The resulting PH$_3$ is then introduced into the gate oxide film 5 formed over the semiconductor substrate 1, and it presumably deteriorates the insulation properties of the gate oxide film 5.

The test made by the present inventors has revealed that diffusion of PH$_3$ contained in the polycrystalline silicon film 6 formed over various places in the deposition chamber DC can be suppressed by carrying out the heating step under conditions satisfying the following equation: $0.1 \times B \leq A \leq 13 \times B$. The present inventors carried out another test using a CVD apparatus equipped with a deposition chamber DC having a capacity of about 56 liters, specifying A and B to satisfy the above-described conditions, that is, about 45 minutes and about 15 minutes, respectively, and dividing the main surface of the semiconductor substrate 1 into 296 regions. In this test, the deterioration of the insulation properties of the gate insulating film 5 was studied in each divided region. In short, a voltage Vg is applied to the gate insulating film 5 of each region thus divided, and a current Ig that is caused to flow therethrough is measured. The time T is defined as about 60 minutes when the deposition chamber DC has a capacity of about 56 liters. As a result, when the semiconductor substrate 1 is held at a height of UU (refer to FIG. 3), a deterioration in the insulation properties was detected in only 3 regions among the 296 regions, as illustrated in FIG. 5(a). When the semiconductor substrate 1 is held at a height of CL (refer to FIG. 3), a deterioration in the insulation properties was detected in only 8 regions among the 296 regions as illustrated in FIG. 5(b). In FIGS. 5(a) and 5(b), the symbol "A" or "D" indicates a region from which a deterioration in insulation properties was detected, while the symbol "/" indicates a region from which no deterioration in insulation properties was detected. In other words, by heating the deposition chamber DC while minimizing the time B necessary for heating the inside of the deposition chamber DC under a vacuum or not greater than atmospheric pressure, relative to the time A necessary for heating in the deposition chamber DC under atmospheric pressure and then forming the polycrystalline silicon film 6, a deterioration in the insulation properties of the gate oxide film 5 can be prevented effectively without being influenced by the height at which the semiconductor substrate 1 is held in the deposition chamber DC.

On the other hand, when the heating step in the deposition chamber DC under atmospheric pressure is omitted, that is, when T=B, PH$_3$ is diffused from the polycrystalline silicon film 6 that is formed over various places in the deposition chamber DC as soon as the heating step defined by B is started. The PH$_3$ is therefore introduced into the gate oxide film 5 formed over the semiconductor substrate 1, and it deteriorates the insulation properties of the gate oxide film 5. Under such conditions, the present inventors made a similar test to that described with reference to FIGS. 5(a) and 5(b). As a result, when the semiconductor substrate 1 is held at a height of UU (refer to FIG. 3), a deterioration in insulation properties was detected in 162 regions among the 296 regions, as illustrated in FIG. 7(a). When the semiconductor substrate 1 is held at a height of CL (refer to FIG. 3), a deterioration in the insulation properties was detected in 140 regions among the 296 regions, as illustrated in FIG. 7(b). In FIGS. 7(a) and 7(b), "A", "C" and "D" each indicate a region in which a deterioration in insulation properties was detected, while "/" indicates a region in which no deterioration in insulation properties was detected. In consideration of the test results in combination with those shown in FIGS. 5(a) and 5(b), it can be confirmed that diffusion of PH$_3$ from the polycrystalline silicon film 6 formed over various places in the deposition chamber DC can be prevented effectively by heating the inside of the deposition chamber DC under atmospheric pressure after insertion of the semiconductor substrate 1 into the deposition chamber DC. This makes it possible to effectively prevent a deterioration in the insulation properties of the gate oxide film 5.

Figure 8:
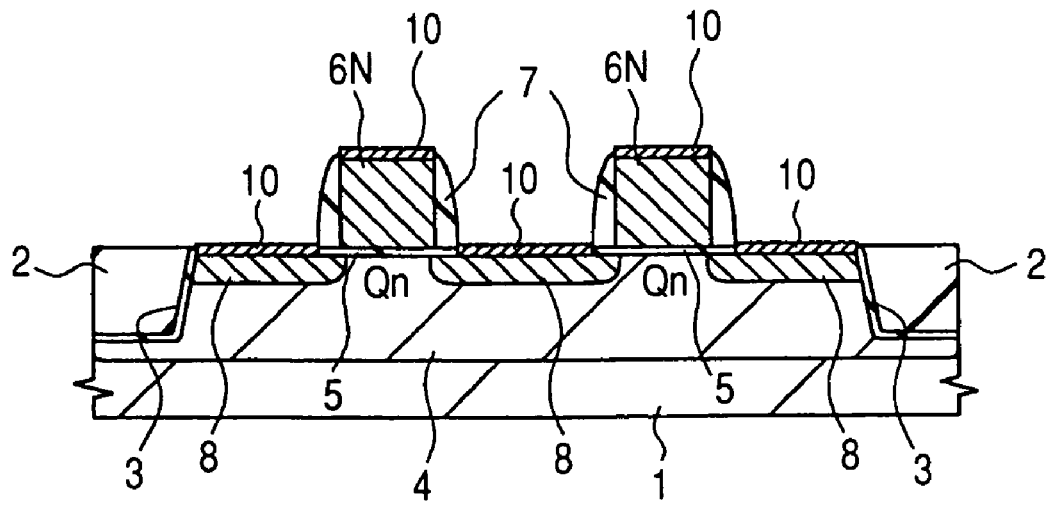
FIG. 8 is a fragmentary cross-sectional view of the semiconductor integrated circuit device during a fabrication step following that of FIG. 2.

As illustrated in FIG. 8, using a photoresist film (not illustrated) patterned by photolithography as a mask, the polycrystalline silicon film 6 is dry etched to form a gate electrode 6N.

After removal of the photoresist film, a silicon oxide film is deposited over the semiconductor substrate 1 by CVD. Anisotropic etching of the silicon oxide film is conducted by reactive ion etching (RIE), whereby side wall spacers 7 are formed over the side walls of the gate electrode 6N. An impurity (such as P) having an n type conductivity is implanted to form, in the p wells 4 on both sides of the gate electrode 6N, n type semiconductor regions 8 constituting the source and drain regions of an n channel MISFET. Alternatively, it is possible to form lightly doped n type semiconductor regions prior to the formation of the side wall spacers 7, and heavily doped n type semiconductor regions after the formation of the side wall spacers 7. By the steps so far described, an n channel MISFETQn can be fabricated.

After washing the surface of the semiconductor substrate 1, a Co (cobalt) film (not illustrated) is deposited over the semiconductor substrate 1, for example, by sputtering. The semiconductor substrate 1 is then heat treated at about 600° C. to cause a silicidation reaction on the interface between the Co film and each of the n type semiconductor regions 8 and gate electrode 6N to form a CoSi$_2$ layer 10. Since this CoSi$_2$ layer 10 is formed, it is possible to prevent the occurrence of an alloy spike which will otherwise be formed between the semiconductor substrate 1 and an interconnect formed over the n type semiconductor regions 8 in a step to be described later.

After removal of the unreacted Co film by etching, heat treatment is conducted at about 700° C. to 800° C. to lower the resistance of the CoSi$_2$ layer 10. This makes it possible to reduce the contact resistance between the interconnect and the n type semiconductor regions 8.

Figure 9:
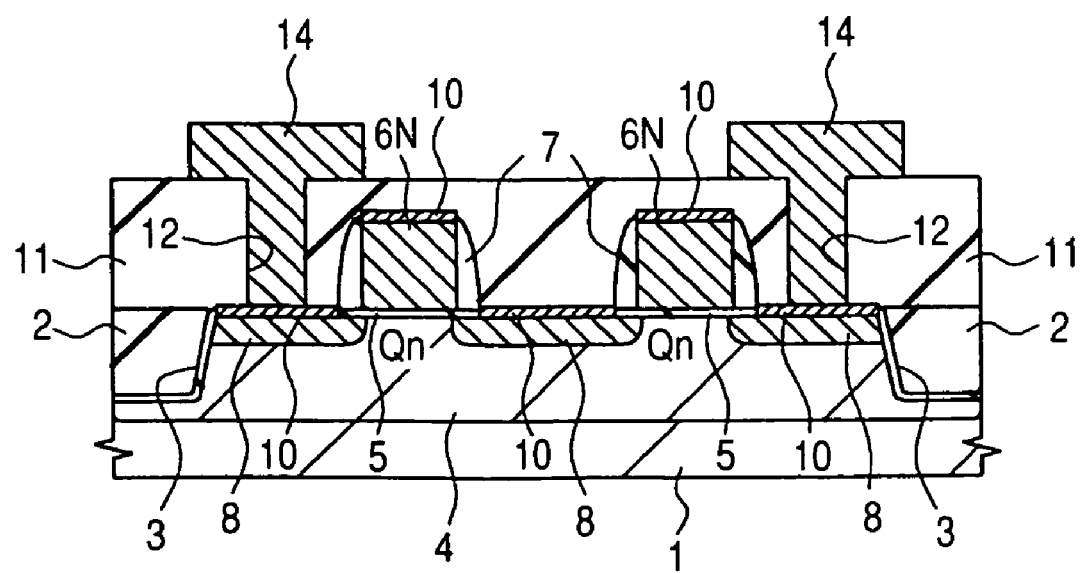
FIG. 9 is a fragmentary cross-sectional view of the semiconductor integrated circuit device during a fabrication step following that of FIG. 8.

As illustrated in FIG. 9, an interlayer insulating film 11 is formed over the n channel type MISFETQn, followed by dry etching of the interlayer insulating film 11 using a photoresist film as a mask to form a through-hole 12 over the n type semiconductor regions 8. Then, an interconnect 14 is formed over the interlayer insulating film 11, whereby the semiconductor integrated circuit device of this Embodiment 1 is fabricated. The interlayer insulating film 11 is formed, for example, by depositing a silicon oxide film by CVD. The interconnect 14 is formed, for example, by depositing a metal film, such as a W or Al alloy, over the interlayer insulating film 11 by sputtering and then patterning the metal film by dry etching using a photoresist film as a mask.

Multilayer interconnects may be formed by repeating the steps of forming the interlayer insulating film 11, through-hole 12 and interconnect 14 plural times.

Embodiment 2

In the method of fabrication of a semiconductor integrated circuit device according to this Embodiment 2, the polycrystalline silicon film 6 (refer to FIG. 2) is formed in accordance with a time chart that is different from that described with reference to FIG. 4 in connection with Embodiment 1.

Figure 10:
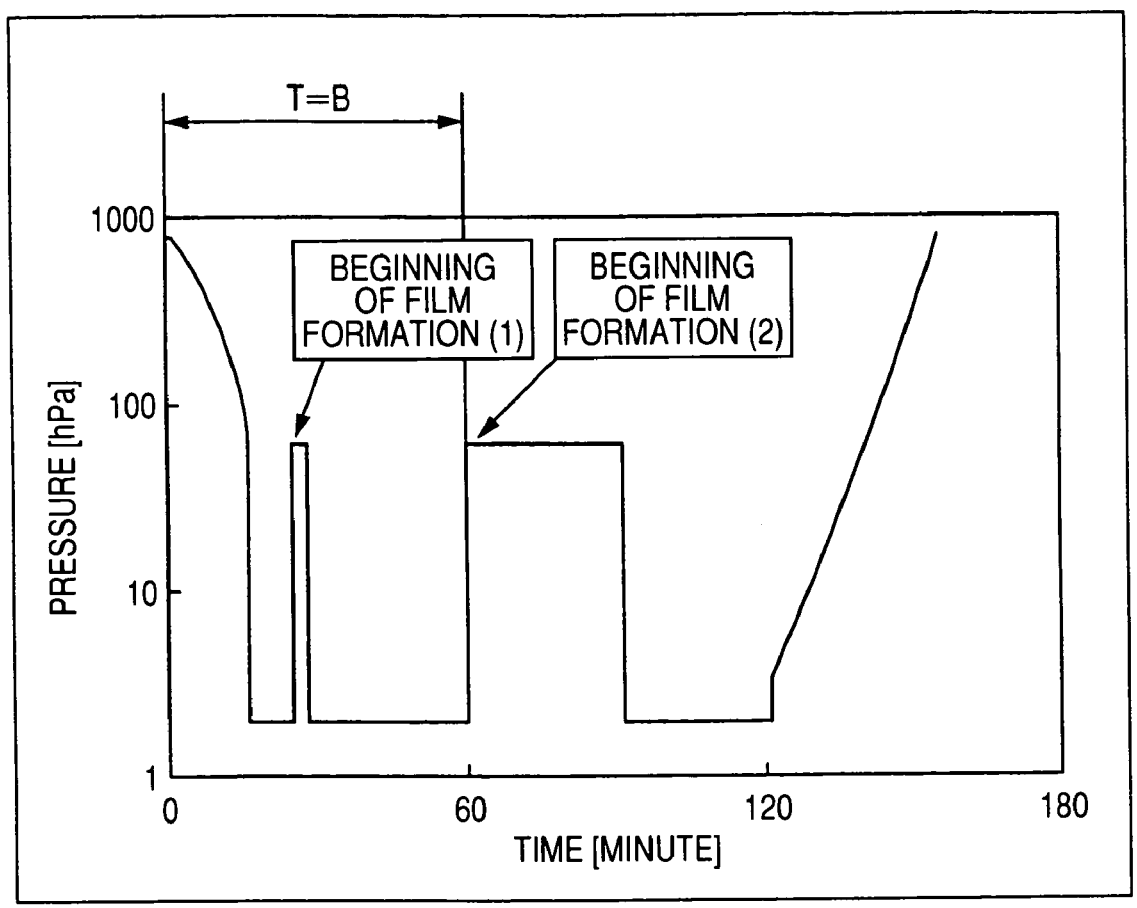
FIG. 10 is a time chart upon deposition of a polycrystalline silicon film during the fabrication of a semiconductor integrated circuit device according to another embodiment of the present invention.

The semiconductor integrated circuit device according to Embodiment 2 is fabricated in a similar manner to that of Embodiment 1 through the steps described with reference to FIG. 1. Then, the semiconductor substrate 1 is inserted into the deposition chamber DC of the CVD apparatus as illustrated in FIG. 3. In accordance with the time chart of FIG. 10, a polycrystalline silicon film 6 is formed. In this Embodiment 2, the pressure in the deposition chamber DC is reduced to a vacuum or not greater than atmospheric pressure immediately after the insertion of the semiconductor substrate 1 into the deposition chamber DC, and heat treatment in the deposition chamber DC is conducted. The time T necessary for heating the inside of the deposition chamber DC before starting the formation of the polycrystalline silicon film 6 is similar to that of Embodiment 1, but during this heating step, as defined by the symbol T, deposition of a thin non-doped polycrystalline silicon film 6 is carried out. With this non-doped polycrystalline silicon film 6, the gate oxide film 5 is covered so that even if heating inside of the deposition chamber DC, while reducing the pressure in the deposition chamber DC to a vacuum or not greater than atmospheric pressure, causes diffusion of PH$_3$ from the polycrystalline silicon film 6, which has already been formed over various places in the deposition chamber DC, the non-doped polycrystalline silicon film 6 protects the gate oxide film 5 and can prevent introduction of PH$_3$ into the gate oxide film 5. In this Embodiment 2, by the heating step as defined by the time T after the formation of such a non-doped polycrystalline silicon film 6, the intended polycrystalline silicon film 6 with PH$_3$ added thereto is deposited.

Then, by employing similar steps to those described with reference to FIGS. 8 and 9 in connection with Embodiment 1, the semiconductor integrated circuit device according to Embodiment 2 is fabricated.

Embodiment 3

Figure 11:
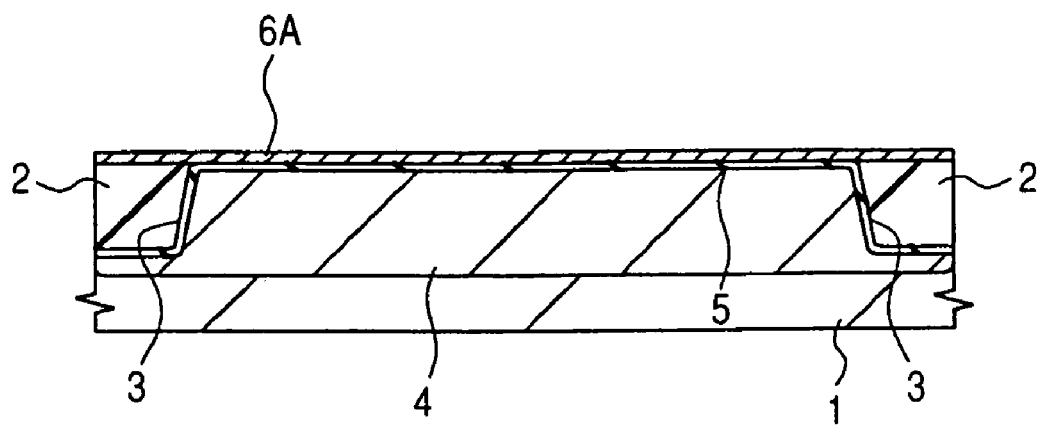
FIG. 11 is a fragmentary cross-sectional view illustrating a step in the fabrication of a semiconductor integrated circuit device according to a further embodiment of the present invention.

The method of fabrication of a semiconductor integrated circuit device according to this Embodiment 3 will be described next with reference to FIGS. 11 and 12.

The fabrication of the semiconductor integrated circuit device according to Embodiment 3 is similar to that of Embodiment 1 through the steps as described with reference to FIG. 1. Then, as illustrated in FIG. 11, a thin intrinsic polycrystalline silicon film 6A is deposited over the semiconductor substrate 1 by using a film forming apparatus (second film forming apparatus) that is different from the CVD apparatus as described with reference to FIG. 3 in connection with Embodiment 1. By this deposition, the gate oxide film 5 is covered with the intrinsic polycrystalline silicon film 6A. Moe specifically, even if PH$_3$ is diffused from the polycrystalline silicon film 6, which has already been formed over various places in the deposition chamber DC, upon subsequent deposition of a new polycrystalline silicon film 6, to which PH$_3$ is added, by the CVD apparatus as described with reference to FIG. 3 in connection with Embodiment 1, the intrinsic polycrystalline silicon film 6 protects the gate oxide film 5 and prevents the PH$_3$ from being introduced into the gate oxide film 5. As a result, a deterioration in the insulation properties of the gate oxide film 5 can be prevented.

Figure 12:
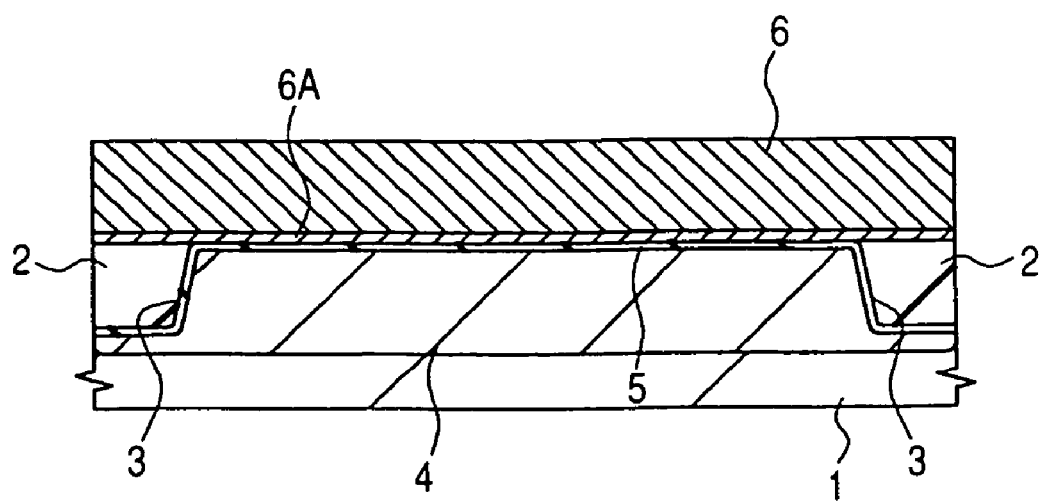
FIG. 12 is a fragmentary cross-sectional view of the semiconductor integrated circuit device during a fabrication step following that of FIG. 11.

As illustrated in FIG. 12, another polycrystalline silicon film 6 is deposited by CVD over the intrinsic polycrystalline silicon film 6, followed by steps similar to those described with reference to FIGS. 8 and 9 in connection with Embodiment 1, whereby the semiconductor integrated circuit device of this Embodiment 3 is fabricated.

Embodiment 4

In this Embodiment 4, a more specific supplementary explanation relative to the Embodiment 1 will be given.

Figure 13:
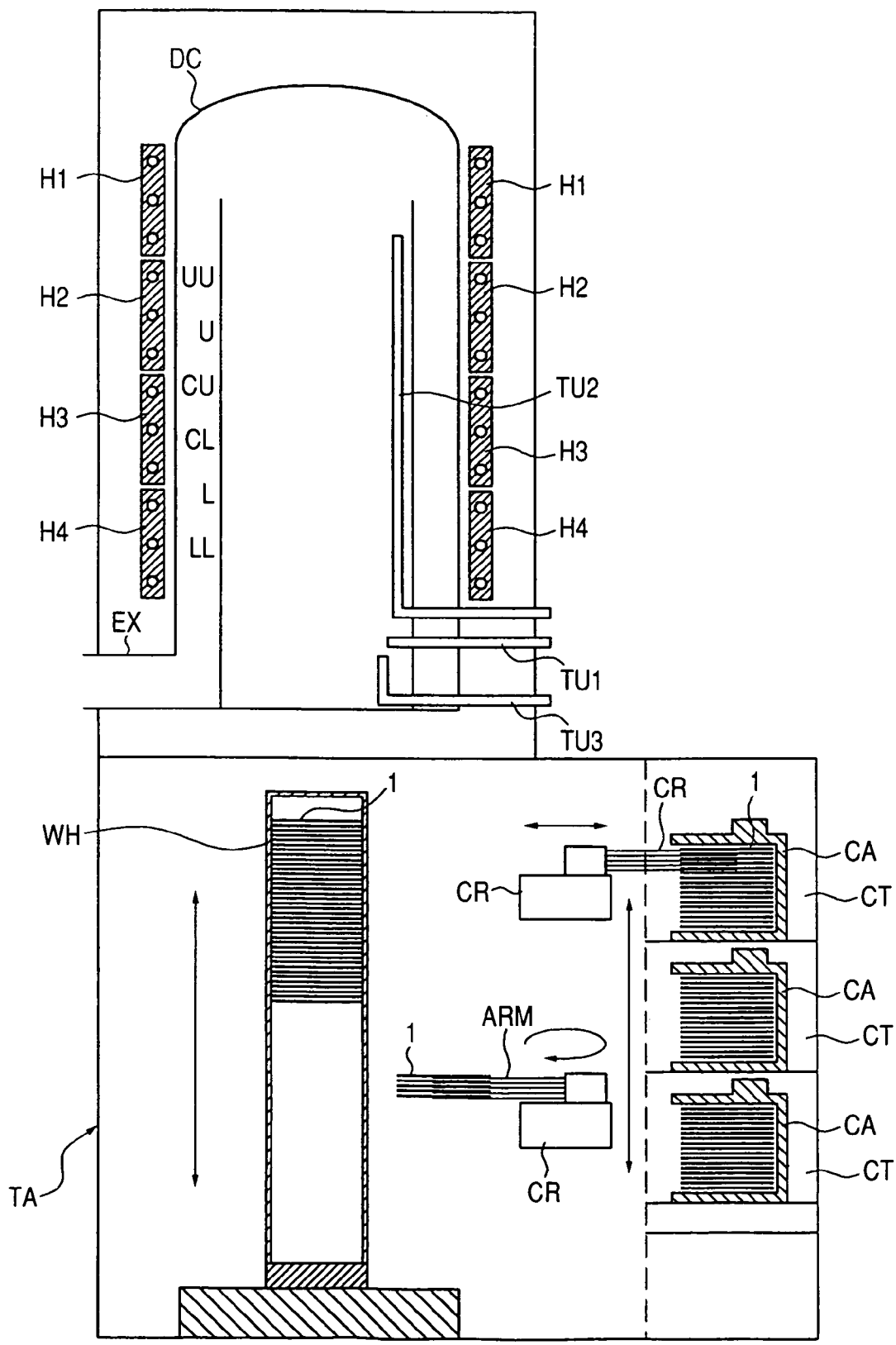
FIG. 13 is a diagram showing the constitution of a CVD apparatus to be used for the fabrication of a semiconductor integrated circuit device according to a still further embodiment of the present invention.

FIG. 13 illustrates more details of the constitution of the low pressure CVD apparatus described with reference to FIG. 3 in connection with Embodiment 1.

As illustrated in FIG. 13, a wafer holder can be moved vertically between the deposition chamber DC and a transfer chamber TA, which is disposed below the deposition chamber DC. After a predetermined number of semiconductor substrates 1 have been placed on the wafer holder WH in the transfer chamber TA, the wafer holder WH is lifted into the deposition chamber DC. After completion of the formation of a polycrystalline silicon film 6 (semiconductor film (refer to FIG. 2)) over the semiconductor substrate 1, the wafer holder WH is moved down to the transfer chamber TA again. Thus, the low pressure CVD apparatus of this Embodiment has a vertical deposition chamber DC.

In the transfer chamber TA, a cassette shelf CT is formed for disposing wafer cassettes therein. In a wafer cassette CA, a plurality of the semiconductor substrates 1 can be stored. In this Embodiment, the temperature inside of the transfer chamber TA is room temperature (about 20° C.).

In the transfer chamber TA, disposal of the semiconductor substrate 1 on the wafer holder WH and ejection, from the wafer holder WH, of the semiconductor substrate 1 over which the polycrystalline silicon film 6 has been formed are carried out by a carrier robot. This carrier robot has a plurality of carrier arms ARM for carrying the semiconductor substrate 1 while causing the backside thereof to adsorb to the arms. By vertical, horizontal and rotary movements, it takes out a plurality of the semiconductor substrates 1 simultaneously from the wafer cassette CA and disposes these semiconductor substrates 1 on the wafer holder WH. When a predetermined number of the semiconductor substrates 1 (about 150 substrates when the diameter of the semiconductor substrate 1 is about 150 mm (about 6 inch)) are placed on the wafer holder WH, the wafer holder WH is moved up to the deposition chamber DC, and the polycrystalline silicon film 6 is formed over each semiconductor substrate 1. When the formation of the polycrystalline silicon film 6 has finished, the wafer holder WH is moved down to the transfer chamber TA, and the carrier robot CR takes out the semiconductor substrate 1 from the wafer holder WH and stores it in the wafer cassette CA.

The deposition chamber DC has, outside thereof, heaters H1, H2, H3 and H4 for heating the deposition chamber DC. Heating by these heaters H1, H2, H3 and H4 makes it possible to constantly keep the temperature inside of the deposition chamber DC at from 500 to 600° C.

These heaters H1, H2, H3 and H4 can be set at respective temperatures, and a temperature gradient can be formed for the heating of the deposition chamber DC. When the film forming gases, that is, $SiH_4$ and $PH_3$ gases, are introduced from the lower part of the deposition chamber DC, the temperatures of the heaters are set so that the heating temperatures become higher progressively from the heater H4 that is installed at the relatively lower part of the deposition chamber toward the heater 1 installed at the relatively upper part of the deposition chamber DC. The film forming gases introduced from the lower part of the deposition chamber DC go up while being thermally decomposed. The film forming gases therefore experience a slow down in the pace of thermal decomposition as they go up toward the upper part of the deposition chamber DC. In other words, it becomes difficult to deposit the polycrystalline silicon film 6 over the semiconductor substrate 1. As described above, by forming a temperature gradient so that the heating temperature becomes progressively higher from the heater 4 toward the heater 1, thermal decomposition of the film forming gases can be promoted even at the upper part of the deposition chamber DC. Since it is possible to set the temperatures of the heaters H1, H2, H3 and H4 independently, the deposition chamber can, of course, be heated by heaters that are set at almost the same temperature.

In this Embodiment 4, four heaters H1, H2, H3 and H4 are installed outside of the deposition chamber DC. It is also possible to use one heater or plural heaters other than four insofar as similar heating to that provided by the four heaters H1, H2, H3 and H4 can be attained. Plural heaters that are different in size can also be installed.

Figure 14:
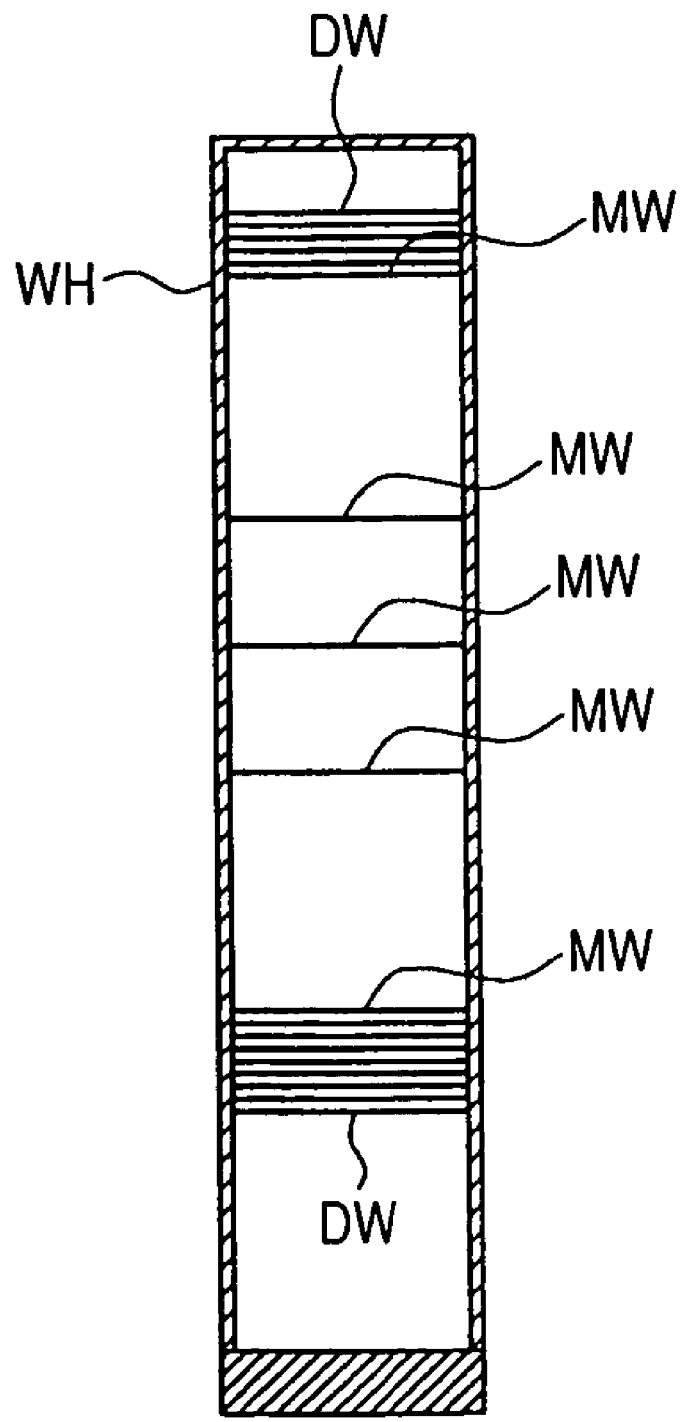
FIG. 14 is a diagram illustrating a wafer holder of the CVD apparatus as illustrated in FIG. 13 and the constitution of semiconductor substrates disposed over the wafer holder.

FIG. 14 is a diagram illustrating a method of disposing the semiconductor substrate 1 on the wafer holder WH. In FIG. 14, illustration of the semiconductor substrate 1 (which will be a product) over which the semiconductor integrated circuit device of this Embodiment is to be formed in practice is omitted.

In this Embodiment, about 150 semiconductor substrates 1 having a diameter of about 150 mm (6 inches) are disposed in the wafer holder WH. Of these, the 20 substrates disposed at the bottom part and the 5 substrates disposed at the top part of the wafer holder WH are dummy wafers DW for rectifying the film forming gases in the deposition chamber DC during film formation. Between the upper and bottom dummy wafers DW, several monitor wafers MW (for example, 5 wafers) are disposed at proper distances. These monitor wafers MW are inserted in order to measure the concentration of $PH_3$ doped into the polycrystalline silicon film 6 and to measure the thickness of the deposited polycrystalline silicon film 6. These dummy wafers DW and monitor wafers MW are prepared separately from the semiconductor substrates 1 over which the semiconductor integrated circuit device of this Embodiment is to be formed in practice.

Figure 6:
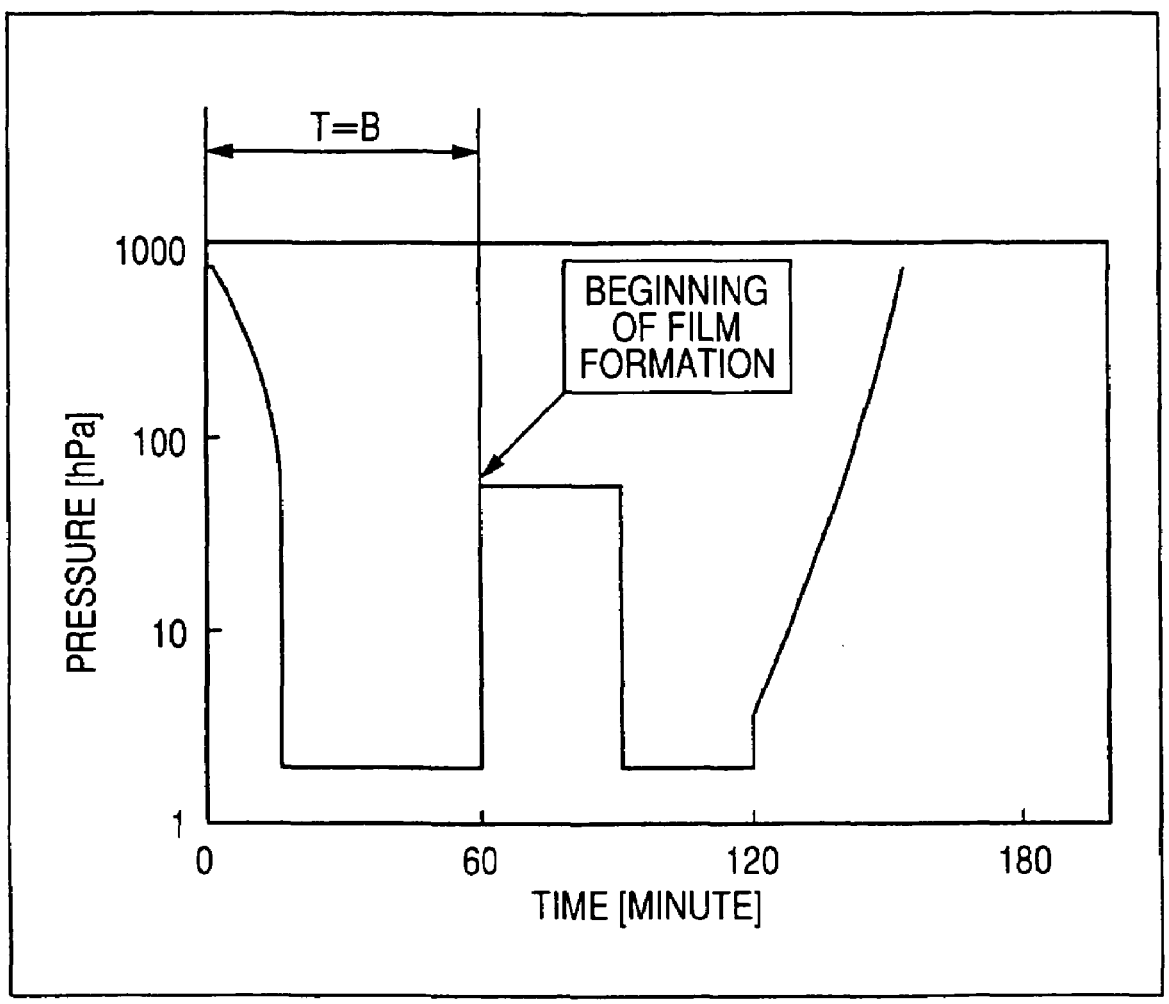
FIG. 6 is a time chart upon deposition of a polycrystalline silicon film by another fabrication process used for comparison with that of the semiconductor integrated circuit device according to the one embodiment of the present invention.
Figure 7:
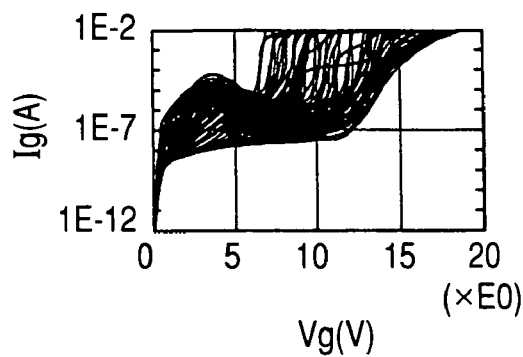
FIGS. 7(a) and 7(b) are graphs with accompanying diagrams illustrating the insulation properties of a gate oxide film when a polycrystalline silicon film is formed by a fabrication process different from that of the semiconductor integrated circuit device according to the one embodiment of the present invention.
Figure 7:
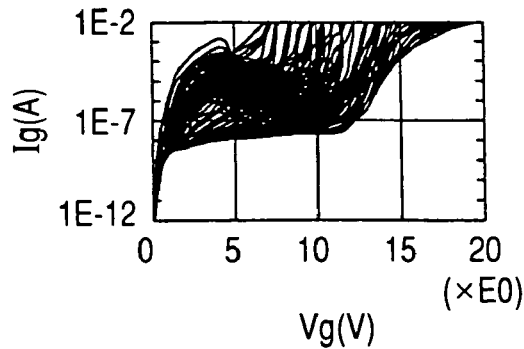
Figure 15:
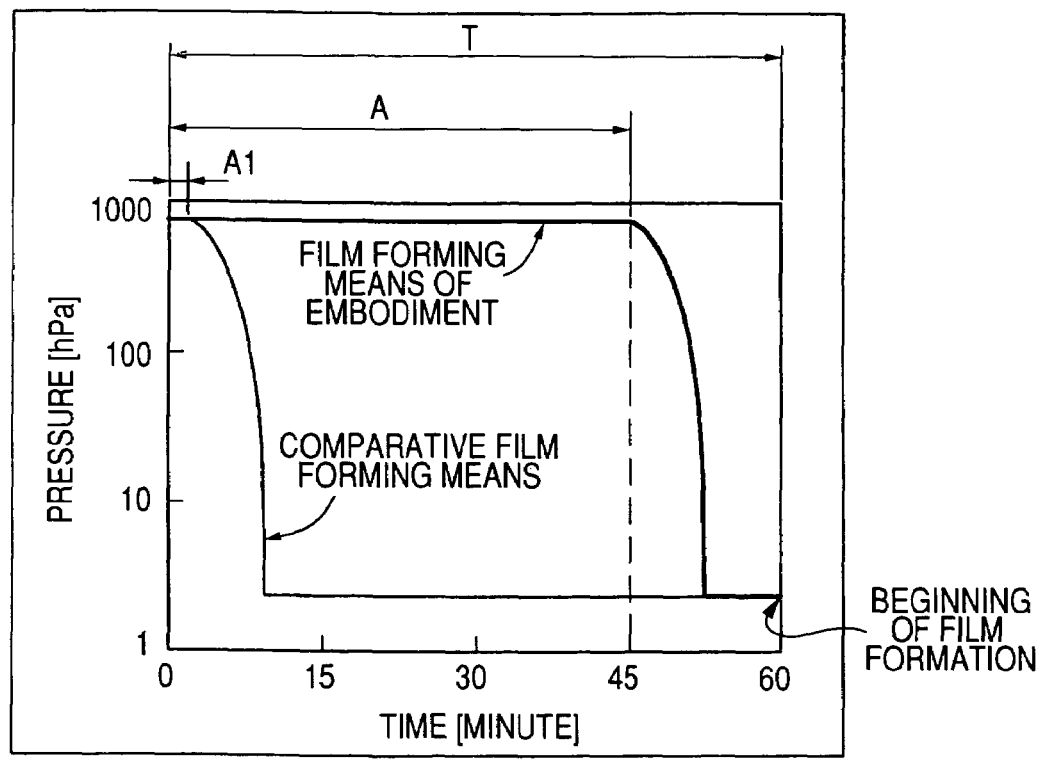
FIG. 15 is a time chart illustrating a pressure change in a deposition chamber upon deposition of a polycrystalline silicon film during the fabrication of the semiconductor integrated circuit device according to a still further embodiment of the present invention.
Figure 16:
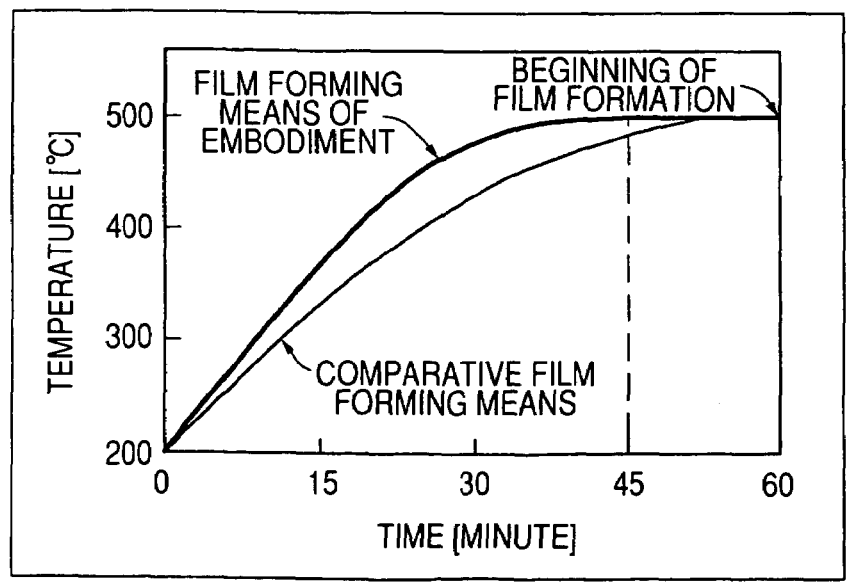
FIG. 16 is a time chart illustrating a temperature change in a deposition chamber upon deposition of a polycrystalline silicon film during the fabrication of the semiconductor integrated circuit device according to a still further embodiment of the present invention.

FIG. 15 illustrates, of the time charts illustrated in FIGS. 4 and 6 in connection with Embodiment 1, a pressure change in the deposition chamber DC until the formation of the polycrystalline silicon film 6 is started. FIG. 16 illustrates a temperature change of the semiconductor substrate 1 with the passage of time until the formation of the polycrystalline silicon film 6 is started. The pressure change illustrated in FIG. 15 and the temperature change illustrated in FIG. 16 each starts when the insertion of the wafer holder WH into the deposition chamber DC is completed. In the time chart illustrated in FIG. 6 for Embodiment 1, a pressure reduction in the deposition chamber DC is started as soon as the insertion of the wafer holder WH into the deposition chamber DC is completed. In spite of the intention to start a pressure reduction as soon as the insertion of the wafer holder WH into the deposition chamber DC is completed, a pressure reduction in most cases starts after some time lag (for example, several seconds) in actual practice. FIG. 15 illustrates a pressure change in consideration of such a time lag. In this Embodiment, the heaters H1, H2, H3 and H4 used for heating of the deposition chamber DC are all set at a similar temperature and a temperature gradient is not formed for the heating of the deposition chamber DC.

FIG. 15 shows the time spent for heating of the deposition chamber DC until the pressure reduction in the deposition chamber is started. In this diagram, the symbol A indicates the time of the time chart (corresponding to FIG. 4 in connection with Embodiment 1) in the film forming unit of this Embodiment, while the symbol A1 indicates the time of the time chart (corresponding to FIG. 6 in connection with Embodiment 1) in the film forming means employed for comparison with that of this Embodiment.

The temperature of the semiconductor substrate 1 shown in FIG. 16 is that of the semiconductor substrate 1 (first semiconductor substrate) disposed at the lowest part of the wafer holder WH among the semiconductor substrates 1 disposed therein. Since, upon insertion of the wafer holder WH into the deposition chamber DC, the insertion of the upper part of the wafer holder WH starts first and the temperature inside of the deposition chamber DC is heated constantly from about 500° C. to 600° C., the semiconductor substrate 1 which is disposed at a relatively upper part is heated during the insertion of the wafer holder WH into the deposition chamber DC. When the insertion of the wafer holder WH into the deposition chamber DC is completed, there exists, for example, a temperature difference such that the semiconductor substrate 1 at the top part and the semiconductor substrate 1 at the lowest part, for example, are about 300° C. and about 200° C., respectively. Even when the semiconductor substrate 1 at the top part reaches a temperature permitting film formation by heating through the heaters H1, H2, H3 and H4, the semiconductor substrate 1 at the lowest part does not always reach a temperature permitting film formation. In other words, it is possible to judge whether all the semiconductor substrates 1 disposed in the wafer holder WH have reached the temperature permitting film formation or not, by confirming that the semiconductor substrate 1 at the lowest part reaches the temperature permitting film formation. When a temperature gradient is formed for the heating by the heaters H1, H2, H3 and H4 and, thereby, a semiconductor substrate 1 other than the semiconductor substrate 1 at the lowest part reaches the temperature permitting film formation last, it is only necessary to observe a temperature change in a semiconductor substrate 1 other than the semiconductor substrate 1 at the lowest part.

As illustrated in FIG. 15, in the film forming means according to this Embodiment, a pressure reduction in the deposition chamber DC is started after the insertion of the semiconductor substrate 1 into the deposition chamber DC is completed, and the semiconductor substrate 1 is heated to at least about 90% of the temperature (first temperature (for example, about 500° C.)) at which the film formation can be started. In this Embodiment, "at least about 90% of the temperature" is based on the degrees Celsius. As described above, the temperature in the deposition chamber DC is constantly heated to about 500 to 600° C. This means that the semiconductor substrate 1 can be maintained at a temperature permitting film formation so that when the temperature reaches a temperature permitting film formation, the temperature change of the semiconductor substrate 1 stops and becomes stable. Until the pressure reduction is started, the pressure in the deposition chamber DC is kept at atmospheric pressure (first pressure). In other words, the deposition chamber DC is kept at a pressure (first pressure) at least equal to the pressure (third pressure) under which the film formation is conducted.

The time until the pressure reduction in the deposition chamber DC is started after the insertion of the wafer holder WH into the deposition chamber DC is designated as "A". The pressure reduction in the deposition chamber DC stops when the pressure in the deposition chamber DC becomes that permitting film formation and the deposition chamber DC is maintained at this pressure. In other words, after the pressure of the deposition chamber DC is reduced to a pressure (second pressure) not greater than a pressure (third pressure) under which the film formation is conducted, a film forming gas for forming a film in the deposition chamber DC is fed and film formation is conducted under the pressure for film formation.

In the case of the film forming means compared with that of this Embodiment, although some interval time Al exists until the starting of the pressure reduction in the deposition chamber DC after the wafer holder WH is inserted into the deposition chamber DC, the pressure reduction in the deposition chamber DC is started almost just after the insertion of the wafer holder WH into the deposition chamber DC. In other words, the pressure reduction in the deposition chamber DC is conducted before the temperature of the semiconductor substrate 1 reaches a temperature permitting film formation. The semiconductor substrate 1 is therefore heated in the deposition chamber DC under a pressure close to vacuum compared with that in the film forming means of this Embodiment. This makes it difficult to increase the temperature of the semiconductor substrate 1 compared with that in the film forming means of this Embodiment (refer to FIG. 16). As in the film forming means of this Embodiment, the pressure reduction in the deposition chamber DC stops when the pressure in the deposition chamber DC becomes a pressure permitting film formation, and, under this pressure, the inside of the deposition chamber DC is maintained.

Both in the film forming means of this Embodiment and the film forming means compared therewith, the pressure reduction in the deposition chamber DC is carried out within a time short enough not to generate foreign matter in the deposition chamber DC. This is because when another treatment is conducted during pressure reduction, there is a danger of foreign matter being introduced in the deposition chamber DC; and, when the foreign matter is introduced in the deposition chamber DC, there is a fear that there will be a deterioration in the quality of the polycrystalline silicon film thus formed.

The present invention has been described based on various embodiments of the present invention. However, should be borne in mind that the present invention is not limited to the described embodiments. It is needless to say that modifications can be made within an extent not departing from the scope of the invention.

For example, $PH_3$ was added to the polycrystalline silicon film in the above-described embodiment, but $AsH_3$ may be added, instead.

In the above-described embodiment, an n-channel MISFET was formed, but the fabrication of a semiconductor integrated circuit device according to the present invention can also be applied to the formation of a p channel MISFET. In this case, $B_2H_6$ or the like is added to the polycrystalline silicon film which will serve as a gate electrode.

The above-described method of formation of a polycrystalline silicon film can be applied not only to the formation of a polycrystalline silicon film which is to serve as a gate electrode material, but also to the formation of a polycrystalline silicon film which is to be used as a lower electrode of the capacitor of a DRAM.

The present invention can be applied to the fabrication of a semiconductor integrated circuit device, including a MISFET and a DRAM (Dynamic Random Access Memory), and to the fabrication of a micromachine.

The invention claimed is:

1. A fabrication method of a semiconductor integrated circuit device, comprising the steps of:
    (a) forming an insulating film over a semiconductor wafer;
    (b) after the step (a), inserting the semiconductor wafer into a thermal chemical vapor deposition chamber of a first film forming apparatus;
    (c) heating the inside of the chamber; and
    (d) after the step (c), forming a silicon film added with a conductive impurity over the insulating film by a chemical vapor deposition method,
    said step (c) comprising the sub-steps of:
    (c1) heating the inside of the chamber while keeping the inside of the chamber at atmospheric pressure; and
    (c2) after the sub-step (c1), heating the inside of the chamber while adjusting the pressure inside of the chamber to vacuum or not greater than atmospheric pressure,
    wherein a time required for the sub-step (c1) is longer than a time required for the sub-step (c2).

2. A fabrication method of a semiconductor integrated circuit device, comprising the steps of:
    (a) forming an insulating film over a semiconductor wafer;
    (b) after the step (a), inserting the semiconductor wafer into a thermal chemical vapor deposition chamber of a first film forming apparatus;
    (c) heating the inside of the chamber; and
    (d) after the step (c), forming a silicon film added with a conductive impurity over the insulating film by a chemical vapor deposition method,
    said step (c) comprising the sub-steps of:
    (c1) heating the inside of the chamber while keeping the inside of the chamber at atmospheric pressure; and (c2) after the sub-step (c1), heating the inside of the chamber while adjusting a pressure inside of the chamber to vacuum or not greater than atmospheric pressure, wherein a time required for the sub-step (c1) is 0.1 time or greater but not greater than 13 times as long as a time required for the sub-step (c2).

3. A fabrication method of a semiconductor integrated circuit device, comprising the steps of:
 (a) forming an insulating film over a semiconductor wafer;
 (b) after the step (a), inserting the semiconductor wafer into a thermal chemical vapor deposition chamber of a first film forming apparatus;
 (c) heating the semiconductor wafer while keeping the inside of the chamber at a first pressure;
 (d) after the step (c), reducing a pressure in the chamber to be not greater than a second pressure, while heating the semiconductor wafer; and
 (e) forming a silicon film added with a conductive impurity over the insulating film by a chemical vapor deposition method while keeping a pressure in the chamber at vacuum or a third pressure not greater than atmospheric pressure, wherein in the step (d), pressure is reduced so that the second pressure becomes lower than the third pressure, wherein in the step (c), the semiconductor wafer is heated to bring a temperature thereof close to the first temperature while maintaining the first pressure to be higher than the third pressure, and wherein a time required for the step (c) is longer than that required for the step (d).

4. A fabrication method of a semiconductor integrated circuit device, comprising the steps of:
 (a) forming an insulating film over a semiconductor wafer;
 (b) after the step (a), inserting the semiconductor wafer into a thermal chemical vapor deposition chamber of a first film forming apparatus;
 (c) heating the semiconductor wafer while keeping the inside of the chamber at a first pressure;
 (d) after the step (c), reducing a pressure in the chamber to be not greater than a second pressure, while heating the semiconductor wafer; and
 (e) forming a silicon film added with a conductive impurity over the insulating film by a chemical vapor deposition method while keeping a pressure in the chamber at vacuum or a third pressure not greater than atmospheric pressure, wherein in the step (d), pressure is reduced so that the second pressure becomes lower than the third pressure, wherein in the step (c), the semiconductor wafer is heated to bring a temperature thereof close to the first temperature while maintaining the first pressure to be higher than the third pressure, and wherein the time required for the step (c) is 0.1 time or greater but not greater than 13 times as long as the time required for the step (d).

* * * * *